United States Patent [19]
Weigel

[11] 3,990,315
[45] Nov. 9, 1976

[54] DETENT UHF TUNER WITH PRESET MEMORY

[75] Inventor: Morton L. Weigel, Bloomington, Ind.

[73] Assignee: Sarkes Tarzian, Inc., Bloomington, Ind.

[22] Filed: Aug. 21, 1974

[21] Appl. No.: 499,201

[52] U.S. Cl. .......................... 74/10.45; 74/10.41; 74/10.80; 74/10.85; 74/10.6; 334/2
[51] Int. Cl.² ........................................ F16H 35/18
[58] Field of Search ............ 74/10.85, 10.80, 10.45, 74/10.41, 10.6, 10.52; 334/2

[56] References Cited
UNITED STATES PATENTS

| | | | |
|---|---|---|---|
| 2,981,838 | 4/1961 | Poskozim | 74/10.45 |
| 3,090,932 | 5/1963 | Torrence | 74/10.45 |
| 3,218,589 | 11/1965 | Delp | 74/10.8 |
| 3,599,497 | 8/1971 | Fukumitso | 74/10.52 |
| 3,689,853 | 9/1972 | Badger et al. | 74/10.6 |

*Primary Examiner*—Samuel Scott
*Assistant Examiner*—Randall Heald
*Attorney, Agent, or Firm*—Mason, Kolehmainen, Rathburn & Wyss

[57] ABSTRACT

A detent type tuning mechanism for a UHF tuner having a continuously variable tuning shaft includes a detented selector shaft, a gear train interconnecting the tuner shaft and the selector shaft, and a memory type fine tuning mechanism including a rotatable turret having mounted thereon a plurality of cams each engageable by a fine tuning shaft when the selector shaft is positioned in predetermined ones of the detent positions. Each cam serves as a memory fine tuning system for a predetermined group of adjacent UHF channels. A cam follower interconnects one of the cams and the tuning shaft, and serves to rotate the tuning shaft in response to the rotation of one of the cams by the fine tuning shaft. An indicator dial provides a numerical display of the precise UHF channel selected at each position of the detented selector shaft.

39 Claims, 16 Drawing Figures

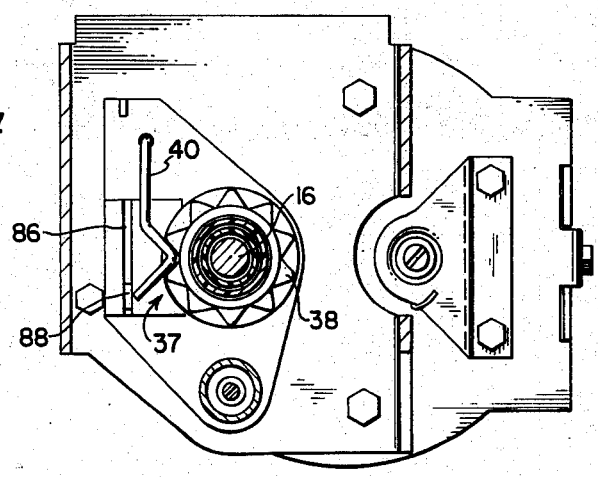
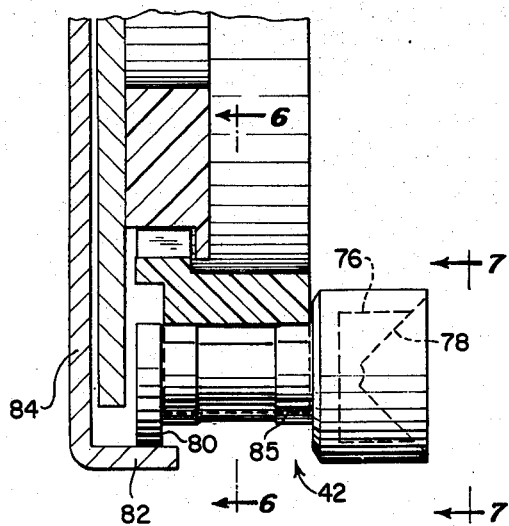
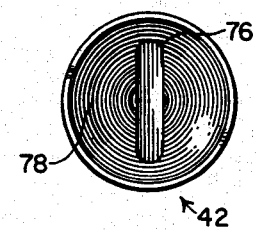
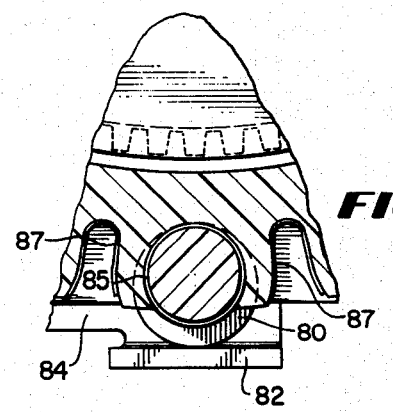
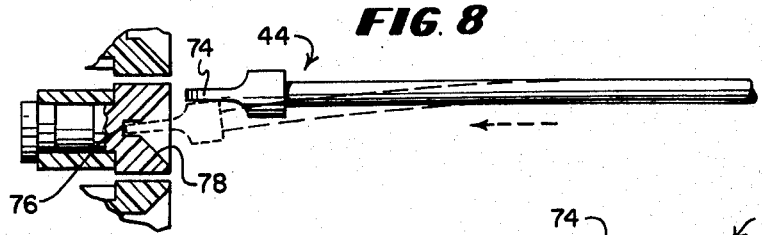

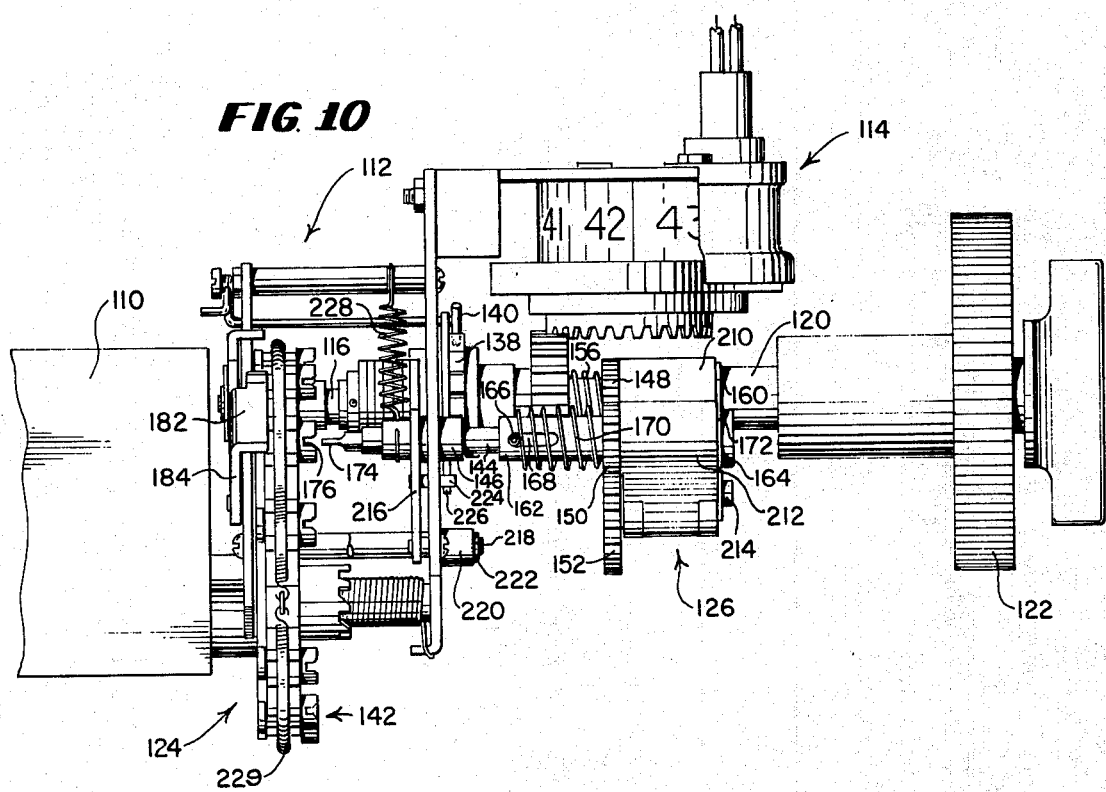
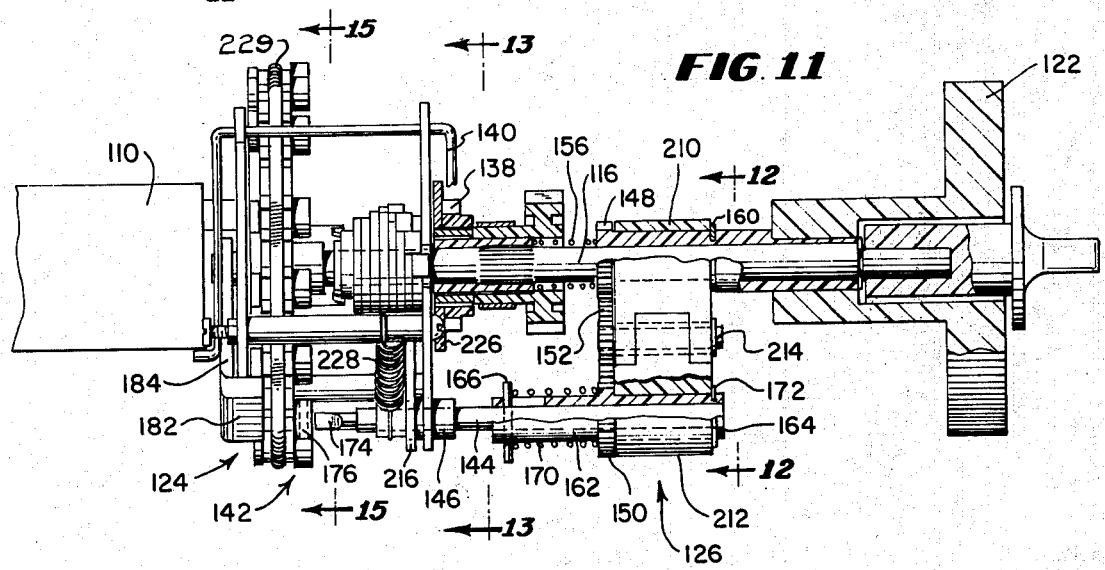
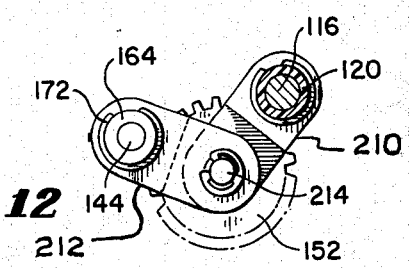

DETENT UHF TUNER WITH PRESET MEMORY

BACKGROUND OF THE INVENTION

This invention relates generally to tuning mechanisms, and more particularly to detented type "memory" tuning systems for UHF television tuners.

Several techniques for providing detent type UHF television tuners are known. Several such systems are described in U.S. Pat. Nos. 3,774,459 issued Nov. 27, 1973 to A. A. Valdettaro; U.S. Pat. No. 3,757,227 issued Sep. 4, 1973 to M. L. Weigel; 3,188,871 issued June 15, 1965 to R. E. Mentzer; U.S. Pat. No. 3,697,904 issued Oct. 10, 1972 to E. Mohri et al.; and U.S. Pat. No 3,205,720 issued Sep. 14, 1965 to T. D. Smith. An example of a commercial memory type VHF tuner is the RCA KRK 72 RVS 8242 3. A memory type UHF tuner has also been built by German Phillips Ltd. The Phillips tuner is described in an article by J. Korn entitled "Neuartige Abstimmhilfen fur UHF" appearing in "FUNKSCHAU", Vol. 12, p. 326, 1962.

Whereas these systems provide detent type UHF tuners, the Valdettaro patent does not provide a memory type fine tuning system. A memory type fine tuning system is a system wherein each channel (or group of adjacent channels) has an independent fine tuning mechanism for providing independent fine tuning of each channel, the setting of which is maintained despite changes in channel selection. Other prior art systems provide memory type fine tuning, however, because the fine tuning mechanism is tunable over three channels and also serves as a channel selector, the resettability of each channel is marginal, and generally some degree of fine tuning adjustment is required after each channel change. Furthermore, the channel number displayed is not independent of the position of the fine tuning control, and a unique indication of the channel number is not provided.

Modern VHF tuners, such as the RCA unit referenced above, utilize a turret or a switch type tuner that has inherent detent positions. As a result, the problems encountered in converting the continuously variable motion of a UHF tuner to detented operation do not arise.

The Phillips UHF tuner is designed for the European UHF band and employs a separate fine tuning element for each UHF channel. Such a system is usable in Europe because the European UHF band contains only 40 channels. In the United States, where 70 UHF channels are provided, the use of a separate tuning element for each channel would result in a structure so large and complex as to be impractical.

Accordingly, it is an object of the present invention to provide a UHF tuning system wherein each detent position of the selector shaft corresponds to a different UHF channel, and wherein a memory type fine tuning mechanism is provided to allow independent fine tuning of groups of channels lying in adjacent detent tuning positions.

It is another object of the present invention to provide a detented UHF memory type tuning mechanism having a digital readout that uniquely displays the channel number corresponding to each channel independently of the setting of the fine tuning mechanism.

A further object of the present invention is to provide a detent type UHF tuning mechanism having a memory tape fine tuning mechanism tunable over the frequency range of one television channel.

Still another object of the present invention is to provide a detented memory type UHF tuner mechanism wherein the range of UHF television channels is covered by more than one revolution of the selector shaft, and wherein each channel in the tuning range is covered by a different one of the detented positions.

SUMMARY OF THE INVENTION

In accordance with the preferred embodiment of the invention, a UHF tuner having a continuously variable tuning shaft is coupled to a detented selector shaft by means of a reduction gear mechanism. The gear reduction ratio is chosen such that the selector shaft may be rotated several revolutions over the tuning range of the UHF tuner, and such that each detent position corresponds to one of the UHF channels in the tuning range. A rotatable turret having a plurality of cams mounted thereon is provided, and a fine tuning mechanism is provided for selectively engaging and rotating one of the cams. The particular one of the cams to be engaged is determined by the position of the rotatable turret. A cam follower is provided for coupling the cam that is positioned for engagement by the fine tuning mechanism and the continuously variable tuning shaft to provide a slight rotation of the tuning shaft in response to rotation of the cam. The range of rotation of the tuning shaft by the cam is limited to less than the band width of a television channel to prevent the tuner from being tuned to an adjacent channel by the fine tuning shaft. The memory function is provided by rotating the turret to bring a different cam into engagement with the cam follower for each UHF television station in the reception area and adjusting each cam to individually fine tune each UHF television station. In order to prevent an unintentional readjustment of the cam during the rotation of the turret, a mechanism is provided to disengage the cam follower from the cam during rotation of the turret.

DESCRIPTION OF THE DRAWINGS

In the drawings:

FIG. 4 is a front sectional view of the tuning mechanism according to the invention taken along line 4—4 of FIG. 2;

FIG. 5 is a cross-sectional view of the fine tuning turret taken along line 5—5 of FIG. 3 showing one of the cams and the cam follower in engagement therewith;

FIG. 6 is a cross-sectional view of the fine tuning cam and the fine tuning cam follower shown in FIG. 5 taken along line 6—6 thereof;

FIG. 7 is an end view of the cam shown in FIG. 5 taken along line 7—7 and showing the engagement slot provided therein;

FIG. 8 is a partial, cross-sectional, side view of the cam shown in FIG. 5 showing a flexible shaft cam driving member being brought into engagement with the cam for adjustment thereof;

FIG. 9 is a detailed view of the end of the flexible shaft cam driving member of FIG. 8 showing the cam engaging blade thereof rotated 90° with respect to the view shown of FIG. 8;

FIG. 10 is a side view of a UHF television tuner employing an alternative embodiment of the detented type tuning mechanism according to the invention;

FIG. 11 is a top view, partially in cross section, of the tuner and tuning mechanism shown in FIG. 10;

FIG. 12 is an end view, partially in cross section, of the cam driving member of the tuning mechansim according to the invention taken along line 12—12 of FIG. 11;

DETAILED DESCRIPTION OF THE INVENTION

Figure 1:
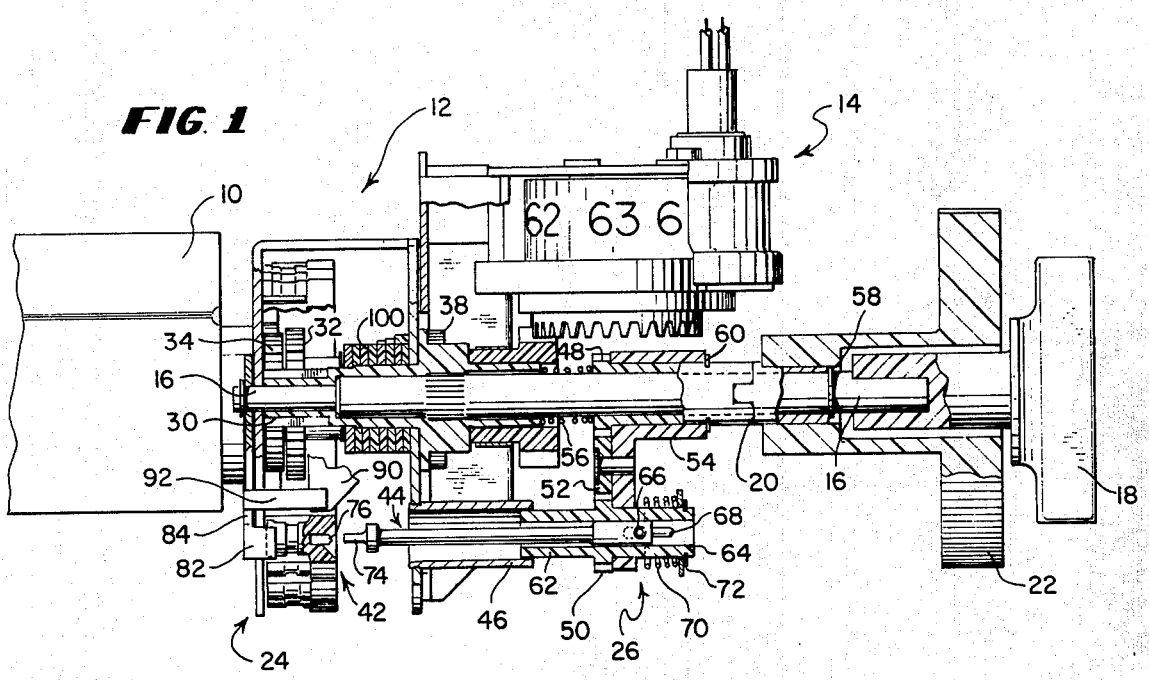
FIG. 1 is a sectional side view of a UHF television tuner employing a preferred embodiment of the detented memory type tuning mechanism according to the invention and having a channel indicator dial mounted thereon.

Referring to the drawings, with particular reference to FIG. 1, there is shown a continuously variable UHF tuner 10 and the detented memory type tuning mechanism according to the invention generally designated as 12. A channel indicator dial generally designated by the numeral 14 is mounted on the tuning mechanism 12 and provides a digital readout of the number of the channel selected. The tuning indicator dial is more fully described in copending U.S. pat. application Ser. No. 257,846, filed May 30, 1972, now U.S. Pat. No. 3,916,820; and assigned to the same assignee of the present application. The detented tuning mechanism 12 according to the invention comprises a selector shaft 16 engageable by a tuning knob 18, a two-piece hollow fine tuning shaft 20 engageable by a fine tuning knob 22, a cam turret 24 and a cam adjusting mechanism 26. The selector shaft 16 is coupled to a continuously variable tuning shaft 28 (FIG. 3) of the tuner 10 by means of a speed reducing gear drive mechanism comprising a driving gear 30 attached to the selector shaft 16, a driven gear 32 attached to the tuning shaft 28, and an idler gear 34 coupling the driving gear 30 and the driven gear 32. A ring gear 36 having internally facing teeth is integrally formed in the turret 24 and engages the driving gear 30. Hence, rotation of the selector shaft 16 causes both the tuning shaft 28 and the turret 24 to rotate; the ring gear 36 of the turret 24 being driven by the driving gear 30, and the driven gear 32 attached to the tuning shaft 28 being driven by the driving gear 30 via the idler gear 34.

Figure 2:
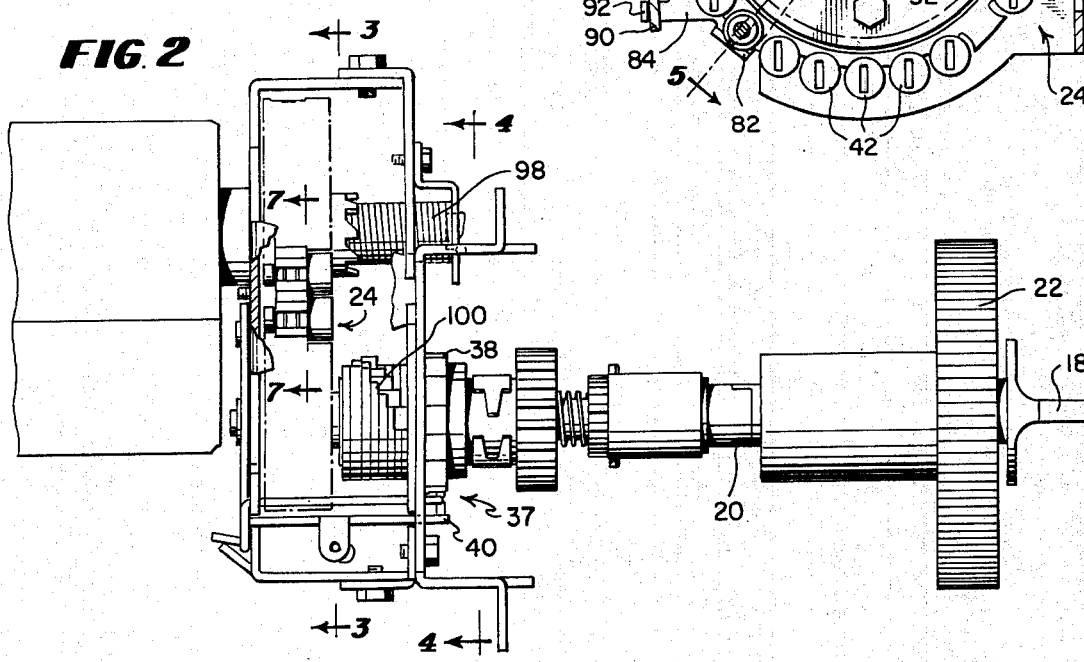
FIG. 2 is a top view of the tuner and tuning mechanism shown in FIG. 1 with the tuning indicator dial removed.

The selector shaft 16 has attached thereto a detenting mechanism comprising an index wheel 38 and a resiliently biased spring member 40, best shown in FIGS. 2 and 4. The detenting mechanism 37 provides discrete tuning positions for the selector shaft 16, each detented tuning position corresponding to one of the UHF television channels. Hence, both the tuning shaft 28 and the turret 24 are adjusted in discrete steps by the tuning shaft 16.

Presently, seventy television channels have been allocated to the UHF television band. In present UHF television tuners such as the tuner 10, tuning over the entire 70 channel band is effected by rotating the tuning shaft 28 by one-half revolution or approximately 180°. Hence, it is extremely difficult for an operator of the television set to select one of the 70 channels by tuning the selector shaft 28 directly, and speed reducing gear means are generally provided to increase the ease with which the television set may be tuned. To further facilitate the tuning of the set, it is desirable to provide a tuning indicator dial to indicate the channel to which the set is tuned. The most accurate of such indicator dials is a dial wherein the number of each channel selected is individually displayed.

In order to provide an optimum drive for a digital type indicator dial, it is desirable to select the gear ratio of the speed reducing means such that tuning over the entire 70 channel band of frequencies is effectuated by seven revolutions of he selector shaft, each revolution covering 10 of the 70 channels. By providing a 14-to-1 reduction ratio between the selector shaft 16 and the tuning shaft 28, and by providing 10 detent positions in the indexing wheel 38, an indexing mechanism compatible with the digital type indicator dials having a tens indicator and a units indicator, such as the one described in the copending Valdettaro application Ser. No. 350,742, filed Apr. 13, 1973, now U.S. Pat. No. 3,842,683, is provided. If an indicator mechanism employing a single indicator, such as shown in FIGS. 1 and 10, is used, any number of detent positions may be provided in the indexing wheel 38.

When a multi-turn detented type selector system such as the one described above is employed, each detented position uniquely defines one of the UHF television channels to be received. However, most continuously tuned UHF television tuners such as the tuner 10 do not have a linear tuner shaft versus receiving frequency characteristics. Furthermore, the operating frequency of the tuner may change with age, temperature and other factors. Hence, detented type tuning systems are generally provided with a mechanism for finely tuning the tuner to compensate for the effects of non-linearity, temperature and aging.

In order to avoid the need for readjusting the fine tuning each time the channel is changed, it is desirable to provide a memory type fine tuning system wherein the fine tuning of each channel may be individually adjusted. Such systems are common in VHF television tuners, however, due to the large number of UHF channels allocated, it is impractical to provide a separate fine tuning mechanism for each of the seventy allocated channels. Fortunately, the Federal Communications Commission does not assign adjacent or nearby UHF channels in any given geographic area, but only assigns every sixth channel to avoid interference. Hence, since only one out of every six channels will ever be used in any geographic area, the channels may be separated into groups, and a separate fine tuning mechcanism provided for each group of channels.

In the embodiment of FIG. 1 the channels are separated into groups of three. Accordingly, the turret 24 is provided with 24 individual adjusting cams 42, each of the cams 42 providing a fine tuning adjustment for a group of three adjacent channels. The reduction ratio between the driving gear 30 and the ring gear 36 is selected such that the turret 24 makes one complete revolution for every seven turns of the selector shaft 16, thereby sequentially bringing each of the cams 42 into position for engagement by the fine tuning mechanism 26.

Referring again to FIG. 1, the fine tuning mechanism 26 includes the fine tuning shaft 20, previously mentioned, a cam driving member 44 and a support sleeve 46 for the cam driving member 44. The fine tuning shaft 20 has a driving gear 48 coupled thereto, and the cam driving member is coupled to a driven gear 50. An idler gear 52 couples the driving gear 48 to the driven gear 50. A gear housing 54 is mounted over the fine tuning shaft 20 and provides support to the idler gear 52 and the driven gear 50.

The fine tuning shaft 20 is slideably mounted over the selector shaft 16. A resilient biasing spring 56 is employed to urge the slideable fine tuning shaft against a stop ring 58 mounted in a groove in the selector shaft 16. A second stop ring 60 is attached to the fine tuning shaft 20 to prevent axial movement between the housing 54 and the fine tuning shaft 20.

The driven gear 50, in this embodiment, has a pair of bushings 62 and 64 molded integrally therewith. The bushing 62 is slideably and rotatably supported by the support tube 46. A securing pin 66 is inserted through a slot 68 in the bushing 64 and through the cam driving member 44. The pin 66 causes the cam driving member 44 to rotate in response to rotation of the gear 52, and the slot 68 allows the member 44 to move axially over a predetermined distance with respect to the gear 52. A resilient biasing spring 70 secured by a retaining ring 72 is employed to urge the gear 50 against a surface of the housing 54.

When the fine tuning mechanism 26 is positioned, as shown in FIG. 1, the cam driving member 44 is not in engagement with any of the cams 42. Fine tuning is achieved by depressing the fine tuning knob 22 along the axis of the selector shaft 16 against the biasing force of the resilient biasing spring 56. Depressing the knob 22 causes the fine tuning shaft 20 and the gear housing 54 to move axially along the selector shaft 16, thereby causing the bushing 62 to slide inside the support tube 46 to bring the cam driving member 44 into engagement with one of the cams 42. Fine tuning is then effected by rotating the fine tuning knob 22 which causes the fine tuning shaft 20 to rotate. The rotation of the tuning shaft 20 is coupled to the cam driving member 44 by means of the gears 48, 50 and 52. The cam driving member 44 is maintained in engagement with the cam 42 by means of the resilient spring 70, and rotation is imparted to the cam 42 by means of a blade 74 which engages a slot 76 in the cam 42.

As the turret 24 is rotated by means of the selector shaft 16, different ones of the cams 42 are brought into position for engagement by the cam adjusting member 44. The gear ratios of the driving gear 30 and the ring gear 36 are selected such that each of the cams 42 remains in position for engagement by the cam driving member 44 for three consecutive detented positions of the selector shaft 16.

However, due to the positive gearing between the selector shaft 16 and the turret 24, the turret 24 is incrementally advanced for each detented advance of the selector shaft 16. As a result, the cam 42 is perfectly aligned with the cam driving member 44 for only one of three positions in which the cam 42 may be engaged by the member 44. In order to assure proper engagement of the cam 42 by the cam driving member 44 when the cam 42 is not perfectly aligned with the member 44, the cam 42 is provided with a specially designed head and the member 44 is fabricated from semi-rigid material to assure that engagement of the cam takes place in each of the three possible engagement positions.

Referring now to FIG. 5 in conjunction with FIG. 8, it may be seen that the cam 42 has a novel head design which allows the slot 76 to be engaged by the blade 74 in spite of a slight misalignment of the cam 42 and the cam driving member 44. In accordance with a preferred embodiment of the invention, the head of the cam 42 is provided with a concave conical surface 78 best shown in FIGS. 5, 7 and 8. The conical surface 78 serves as a guide for guiding the blade 74 into the slot 76. The guiding action provided by the concave surface 78 is best shown with the aid of FIG. 8. FIG. 8 shows the cam driving member 44 in the retracted position (solid lines) in one of the positions wherein perfect alignment of the blade 74 and the slot 76 is not obtained. As the member 44 is extended by the fine tuning mechanism 26, the blade 74 is guided by the surface 78 until the slot 76 is engaged (dotted lines). The shaft of the member 44 is fabricated from resilient material, such as a semi-rigid plastic to allow the shaft of the member 44 to be flexed as required to engage the slot 76. In addition, the blade 74 has the corners thereof rounded as shown in FIG. 9 to conform to the surface 78 when the blade is not positioned parallel to the slot 76. This allows the blade 74 to be rotated within the head of the cam 42 prior to engagement of the slot 76 without scoring the surface 78.

Figure 3:
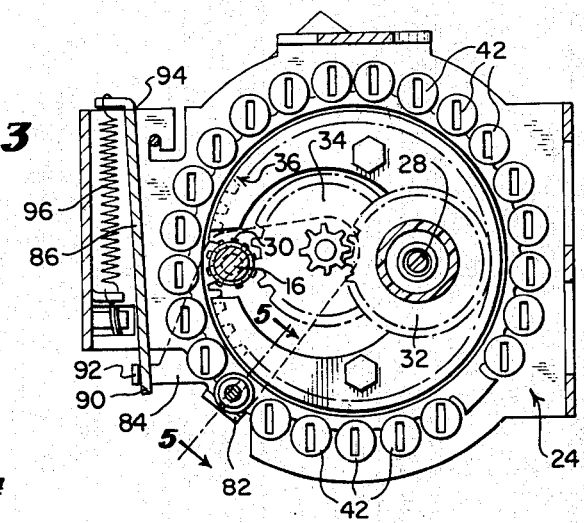
FIG. 3 is a front sectional view of the tuning mechanism according to the invention taken along line 3—3 of FIG. 2 and showing the fine tuning cams, the fine tuning cam follower, and the laterally moveable idler gear.

Fine tuning for one channel out of each group of three adjacent channels is effected by depressing the fine tuning knob 22 to cause the cam 42 to be engaged by the member 44. Rotating the cam 42 adjusts the fine tuning of the tuner 10 in the following manner. Each of the cams 42 is provided with an eccentric cam lobe 80 (FIGS. 3, 5 and 6). The cam lobe 80 of the one of the cams 42 positioned for engagement by the member 44 is engaged by a cam follower member 82. The cam follower 82 forms part of a carrier 84 which is pivotably mounted about the shaft 16 (FIG. 3), and which has the idler gear 34 rotatably mounted thereon. Rotation of the one of the cams 42 engaging the cam follower 82 causes the carrier 84 to be pivoted about the detented selector shaft 16. The latter pivoting motion results in a lateral translation of the gear 34 with respect to the driving gear 30. Since the driving gear 30 is fixedly held in place by the detenting mechanism 37 on the shaft 16, the lateral translation of the gear 34 results in a rotation of the gear 34 about the driving gear 30. The last mentioned rotation is imparted to the driven gear 32, thereby causing a slight rotation of the tuning shaft 28 in response to a rotation of the one of the cams 42.

In order to achieve maximum resettability and to prevent the tuner from being tuned to an adjacent channel by the fine tuning shaft, the lobe of each cam 42 is shaped so that the amount of rotation that can be imparted to the tuning shaft 28 in response to the rotation of any of one of the cams 42 is limited to the minimum degree of rotation necessary to achieve fine tuning. Generally this is less than the bandwidth of one channel, and may be limited to the range of from ± 1 MHz to ± 3 MHz. Because of the limited range of fine tuning adjustment available, the UHF tuner 10 must be resettable with great accuracy, and must not drift appreciably as a result of aging or temperature variations. One such UHF tuner is described in U.S. Pat. No. 3,789,331. When such a tuner is employed, the fine tuning mechanism is used primarily for adjusting the tuner to compensate for local conditions such as interference, signal strength and discontinuities in the response of the receiving antenna.

Each one of the cams 42 provides a memory type fine tuning for one of the channels in each group of three adjacent channels. Fine tuning is accomplished as follows. Firstly, an active station in the broadcasting area is selected, and fine tuning is effected by depressing the fine tuning knob 22 to thereby adjust one of the cams 42 to provide an optimum picture. Since no adjacent or alternate channels are assigned in any single geographic area, no other channel need be fine tuned by means of the cam just adjusted. Tuning to another channel in the area will result in another one of the cams 42 being brought into engagement with the cam adjusting member 44. The cam 42 corresponding to the second channel to be fine tuned is adjusted in a similar manner as the cam corresponding to the first channel. Each of the channels in the area is fine tuned in a similar manner, each channel being tuned by a different one of the cams 42, thereby providing independent fine tuning of each of the television stations broadcasting in a given geographic area. The last mentioned feature makes it possible to switch between channels without readjusting the fine tuning after each channel change.

In order to assure that the setting of each of the cams 42 is maintained whenever a channel change is made, each of the cams 42 is resiliently gripped at its bearing surface 85 (FIGS. 5 and 6) in a press fit by the body of the cam turret 24. This effectively prevents the rotation of the cams 42 as the channel selector shaft 16 is being tuned. Because the friction forces developed in a press fit can result in an undesirable chattering during the adjustment of the cams 42, a high viscosity liquid lubricant having a viscosity in the range of approximately 1.8 to 3.3 kilopoise is applied to the bearing area 85 of the cam 42 at the point of engagement with the turret 24. The high viscosity liquid assures smooth operation of the cams 42 and prevents the undesirable chattering of the cams 42 during adjustment, thereby resulting in much improved resettability of each channel. The lubricant used must have a high viscosity to prevent the cams 42 from being too easily adjustable to minimize accidental readjustment of the cams.

The turret 24 and the cams 42 should be fabricated from materials providing compatible bearing surfaces to assure smooth operation. Both the turret 24 and the cams 42 have been fabricated from an acetal plastic, manufactured under the trademark DELRIN, which has provided satisfactory bearing surfaces. The DELRIN also retains its resiliency when machined, and assures that the cams 42 continue to be resiliently engaged by the turret 24. Unfortunately, DELRIN tends to lose its resiliency when molded, and is quite flammable.

Other plastics, such as that manufactured under the trademark ABS, are not as flammable and also provide good bearing surfaces. Some of these plastics tend to lose their resiliency with age. Therefore, if molded DELRIN or less resilient plastics are used it may be necessary to provide resilient metal spacers such as the spacers 87 (FIG. 6) in the slots in the turret 24 to retain the cams 42.

The relative motion between the cam lobe 80 and the cam follower 82 can also cause undesired rotation of the cam 42 as the turret 24 is rotated. In order to prevent the undesirable interaction between the cam lobe 80 and the cam follower 82, a mechanism is provided for disengaging the cam follower 82 from the cam lobe 80 during the channel changing operation. In a preferred embodiment, the disengaging mechanism includes a lever 86 coupling the carrier 84 and the spring member 40. The lever 86 has a first tab 88 (FIG. 4) engaging the spring member 40, and a second tab 90 engaging a tab 92 of the carrier 84 (FIG. 3). The lever 86 is pivoted at a point 94 and the tab 88 is resiliently biased toward the spring member 40 by a tension spring 96. The lever 86 serves to disengage the cam follower 82 from the cam 42 upon rotation of the selector shaft 16. Operation is as follows. As the selector shaft 16 is rotated during channel selection, the index wheel 38 causes the spring member 40 to be deflected away from the selector shaft 16. The movement of the spring member 40 is imparted to the carrier 84 by means of the lever 86, thereby rotating the lever 86 about the shaft 16 a sufficient amount to disengage the cam follower 82 from the cams 42 whenever the selector shaft 16 is moved from one detented position to another. As a result, no tangential force is applied to the cam lobe 80 as the turret 24 is rotated during the channel changing operation. This reduces the probability of accidentally disturbing the cam 42 during the channel changing operation, and substantially enhances the resettability of the tuner. The only force applied to the cam by the cam follower is directed in a direction perpendicular to the axis of rotation of the cam, and does not affect the setting of the cam.

Resettability error can also occur as a result of backlash in the gear train coupling the selector shaft 16 and the tuner shaft 28. To reduce backlash, a torsion spring 98 engaging the tuner housing and the driven gear 32 is provided. The torsion spring 98 applies a constant preloading force to the driven gear 32, the idler gear 34 and the driving gear 30 to enhance the resettability of the tuner by maintaining the teeth of the gears in engagement at all times. A conventional stop mechanism 100 utilizing a series of stacked stop washers is provided to prevent more than seven rotations of the selector shaft 16, thereby preventing damage to the tuner 10 that could result if the tuning shaft 28 were rotated more than 180°. Alternatively, a stop mechanism such as the one described in the Valdettaro U.S. Pat. No. 3,774,459 may be used.

The alternative embodiment of the detented memory type tuning mechanism according to the invention shown in FIG. 10 is similar to the embodiment shown in FIG. 1, but divides the channels into groups of five so that only 14 cams are required to cover the entire UHF band of 70 channels. Analagous components in FIG. 10 will be designated by numbers from the hundreds of series havings tens and units digits similar to the corresponding tens series numbers of FIG. 1. Non-analagous components will be designated by numbers from the two hundreds series. FIG. 10 shows a continuously variable UHF tuner 110 similar to the tuner 10 shown in FIG. 1, a detented memory type tuning mechanism 112 and a channel indicator dial 114. A rotatable fine tuning turret 124 having a plurality of fine tuning cams 142 is driven by a selector shaft 116 by means of a driving gear 130 attached to the selector shaft 116, a driven gear 132 attached to a tuning shaft 128 and an idler gear 134 (FIG. 15).

Figure 15:
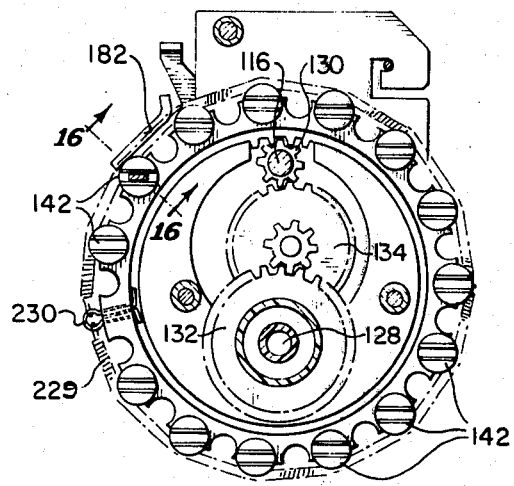
FIG. 15 is a front sectional view taken along line 15—15 of FIG. 11 showing the fine tuning turret and the speed reduction assembly interconnecting the selector shaft and the fine tuning turret.
Figure 16:
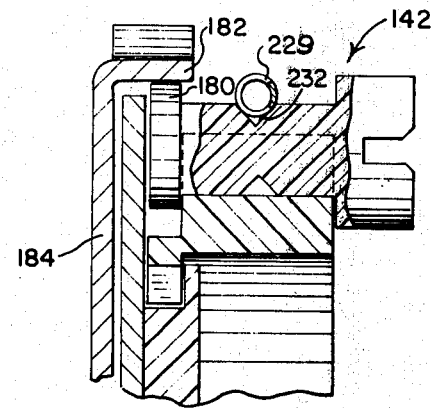
FIG. 16 is a sectional view of one of the fine tuning cams taken along line 16—16 of FIg. 15 showing the engagement of the cam with the fine tuning cam follower and the retaining spring employed to prevent undesired rotation of the cams during the channel changing operation. de

A cam lobe 180 of the fine tuning cam 142 engages a fine tuning cam follower 182 (FIGS. 15 and 16). The cam follower 182 is part of a carrier 184 pivoted about the selector shaft 116. The idler gear 134 is rotatably mounted on the carrier 184.

The operation of the apparatus described above is similar to the operation of the embodiment shown in FIG. 1. As in the embodiment of FIG. 1, the selector shaft 116 is a detented selector shaft having detented positions defined by an index wheel 138 and a spring member 140. Fine tuning is effected by rotating one of the fine tuning cams 142, thereby pivoting the carrier 184 about the shaft 116 to cause the idler gear 134 to move laterally with respect to the driving gear 130 and the driven gear 132.

Whereas the embodiment of FIG. 1 utilizes a cam driving member having a deflectable semi-rigid shaft, the embodiment of FIG. 10 employs a rigid shaft and a cam for repositioning the cam driving member as the turret 124 is rotated to maintain the cam driving member in alignment with one of the fine tuning cams 142 as the turret 124 is rotated.

In order to maintain one of the cams 142 in alignment with the cam driving member, a cam adjusting mechanism 126 having a two-piece articulated arm is provided. The two-piece articulated arm includes a stationary member 210 and a pivoting member 212. The stationary member is affixed to a fine tuning shaft 120 which passes through an aperture in the member 210. A fine tuning driving gear 148 is affixed to the fine tuning shaft 120, and a stop ring 160 is employed to prevent axial movement between the fine tuning shaft 120 and the member 210. The member 212 is pivotally attached to the member 210 by means of a pin 214 which also serves as a shaft for a fine tuning idler gear 152. The fine tuning idler gear 152 drives a driven gear 150. The driven gear 150 has a pair of bushings 162 and 164 molded integrally therewith, the bushing 164 being rotatably mounted in an aperture in the end of the member 212, and secured against axial movement by a stop ring 172. A cam driving member 144 is mounted within the bushing 162 by means of a pin 166. The pin 166 passes through a slot 168 in the bushing 162 which allows axial movement of the member 144 with respect to the bushing 162, but forces the member 144 to rotate in response to the rotation of the driven gear 150 and the bushing 162. A resilient biasing spring 170 is employed to bias the member 144 in an extended position. A sleeve 146 is employed to support the member 144 in alignment with one of the cams 142.

Fine tuning is effected by depressing a fine tuning knob 122, thereby causing axial movement of the fine tuning shaft 120 against the force of a biasing spring 156. Depressing the knob 122 causes the fine tuning shaft 120 and the members 210 and 212 to move axially along the selector shaft 116, thereby causing the member 144 to slide through the support tube 146 to bring a blade 174 of the cam driving member 144 into engagement with a slot 176 in the cam 142. Adjustment of the cam 142 may then be effected by rotating the knob 122.

In order to maintain the member 144 in alignment with one of the cams 142 as the turret 124 is rotated, the sleeve 146 is mounted on a pivotably mounted bracket 216. The bracket 216 has a shaft 218 rotatably mounted within a collar 220 and secured by a snap ring 222. A pin 224 for engaging a cam 226 (FIGS. 10, 13 and 14) is affixed to the bracket 216 in perpendicular relationship thereto. A tension spring 228 is employed to resiliently bias the bracket 216 to maintain the pin 224 in engagement with the cam 226.

The cam 226 is affixed to the tuning shaft 116 for rotation therewith, and causes the bracket 216 to pivot about the shaft 218 to thereby cause the sleeve 146 to move in synchronism with one of the cams 142 for a predetermined number of detent positions of the index wheel 138. This action causes the cam driving member 144 to be maintained in alignment with one of the cams 142 as the turret 124 is rotated. Hence, the slot 176 of one of the cams 142 may at all times be engaged by the blade 174, thereby making it possible to fabricate the member 144 from rigid material.

The cam 226 (FIGS. 13 and 14) is constructed so that one of the cams 142 iis followed by the member 144 for a predetermined number of detent positions (five in this embodiment) of the index wheel 138. After one of the cams 142 has been followed by the member 144 for the predetermined number of detent positions as determined by the shape of the cam 226, the member 144 is brought into alignment with an adjacent one of the cams 142 when the selector shaft is rotated to a subsequent detent position. Hence, each one of the cams 142 is engageable by the member 144 for five adjacent detent positions, whereupon an adjacent cam is brought into position for engagement for the next five adjacent detent positions.

Figure 13:
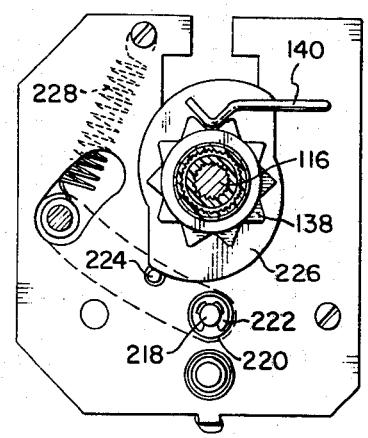
FIG. 13 is a front sectional view of the tuning mechanism taken along line 13—13 of FIG. 11 showing a cam driving member adjusting cam for causing the cam driving member to follow one of the cams as the turret is rotated a predetermined number of detent positions.
Figure 14:
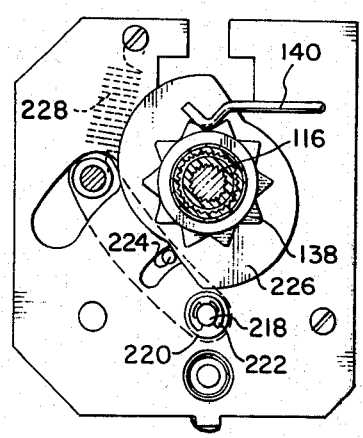
FIG. 14 is another front sectional view of the tuning mechanism taken along line 13—13 showing the cam driving member adjusting cam rotated by one detent position of the selector shaft.

FIG. 13 shows the position of the cam 226 when the member 144 has initially been brought into alignment with one of the cams 142. As the selector shaft 116 and the cam 226 are rotated in a clockwise direction, the pin 224 rides on a successively lower portion of the cam 226 for each successive detent position, until the pin 224 rests at the lowest point of the cam 226 as shown in FIG. 14. The last mentioned position corresponds to the last detent position wherein the member 144 is maintained in alignment with a particular one of the cams 142. Rotating the cam 226 clockwise one more detent position causes the pin 224 to be raised to the peak of the cam 226 as shown in FIG. 13, and causes the member 144 to be moved in a direction opposite to the direction of rotation of the turret 142 and into alignment with an adjacent one of the cams 142, whereupon the cam following sequence may be repeated.

The cam 226 shown in FIGS. 13 and 14 is a two-lobe cam employed in conjunction with a 10-position index wheel 138. Hence, each cam 142 is maintained in alignment with the member 144 for five consecutive detent positions corresponding to five adjacent UHF channels. Such an arrangement is convenient when a dual concentric disc digital indicator dial, such as the one described in the copending Valdettaro application Ser. No. 350,742, filed Apr. 13, 1973, is used. However, if it is desired that each of the cams 142 be used to tune only three adjacent channels, other cam shapes may be employed, such as, for example, a three-lobe cam used in conjunction with a nine-detent position index wheel.

When a strip type dial as shown in FIGS. 1 and 10 is used any number of detent positions may be provided in the index wheels 38 and 138, and any number of lobes may be provided in the cam 226.

The embodiment of FIG. 10 utilizes an alternative approach to prevent undesired readjustment of the cams 142 during the channel changing operation. In the embodiment of FIG. 10, a tensioning spring 229 is employed around the perimeter of the turret 124 to exert an inwardly directed radial force against the cams 142. The spring 229 is secured in place by an eye 230 and a V-shaped annular notch formed in each of the cams 142 (FIGS. 15 and 16). The pressure generated by the spring 229 forces each of the cams 142 against the body of the turret 124, thereby increasing the friction force between the cams 142 and the turret 124 to increase the force required to adjust the cams 142, thereby reducing the probability of accidental readjustment during the channel changing operation.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. A tuning system including in combination:
    a tuner having a continuously variable tuning shaft, rotation of which is effective to tune said tuner over a continuous band of frequencies;
    a selector shaft;
    means for establishing a plurality of equally spaced detent positions for said selector shaft;
    a rotatable turret having a plurality of cam members rotatably mounted thereon;
    means interconnecting said selector shaft, said tuning shaft and said turret, said interconnecting means being operative to rotate said turret a predetermined increment in response to the movement of said selector shaft between each of said detent positions;
    means for selectively engaging a first predetermined single one of said cam members when said shaft is positioned within a first predetermined range of rotation thereof, said engaging means being adapted to engage a second predetermined one of said cam members upon said tuner shaft being positioned within a second predetermined range of rotation thereof, said engaging means including a cam driving member having a deflectable shaft, said deflectable shaft being deflectable a predetermined amount for permitting said cam member to be engaged by said cam driving member for a predetermined range of rotation of said turret; and
    cam follower means operatively coupling the cam member engageable by said engaging means to said tuner, said cam follower means being adapted to adjust said tuner in response to the rotation of one of said cam members to effect fine tuning of said tuning system.

2. A tuning system as recited in claim 1 wherein said cam follower means includes means for rotating said tuning shaft in response to the rotation of one of said cam members.

3. A tuning system as recited in claim 2 wherein said gear means includes gear means having an idler interconnecting having a predetermined axis of rotation mounted for lateral movement, said idler gear being mechanically coupled to said cam follower means and responsive to the rotation of one of said cam members for moving laterally in a plane perpendicular to said predetermined axis of rotation.

4. A tuning system as recited in claim 3 further including a moveable plate having said idler gear rotatably mounted thereto.

5. A tuning system as recited in claim 4 wherein said cam follower means includes a cam follower extending from said moveable plate.

6. A tuning system as recited in claim 5 wherein each of said cam members has an eccentric lobe engageable by said cam follower.

7. A tuning system as recited in claim 6 further including means for retarding the rotation of said cam members in said turret.

8. A tuning system as recited in claim 7 wherein said retarding means includes means for frictionally engaging each of said cam members.

9. A tuning system as recited in claim 7 wherein said retarding means includes a spring engaging said cam members mounted around the periphery of said turret.

10. A tuning system as recited in claim 6 wherein each of said cam members has a head engageable by said engaging means.

11. A tuning system as recited in claim 9 wherein said head has a concave surface having a slot defined therein for receiving said cam driving member.

12. A turning system as recited in claim 11 wherein said cam driving member is mounted for movement along the longitudinal axis of said deflectable shaft for engaging one of said cam members, and said engaging means includes resilient biasing means for urging said cam driving member out of engagement with said cam member.

13. A tuning system as recited in claim 9 wherein said engaging means includes a cam driving member mounted for movement along the periphery of said turret in synchronism with the rotation of said turret for a predetermined range of rotation thereof.

14. A tuning system as recited in claim 13 further including a second cam mounted for rotation with said selector shaft and second cam follower means for engaging said second cam, said second cam follower means being coupled to said cam driving member for moving said cam driving member in synchronism with the rotation of said turret in response to the rotation of said selector shaft.

15. A tuning system as recited in claim 14 wherein said engaging means includes an articulated arm supporting said cam driving member.

16. A tuning system as recited in claim 12 further including a fine tuning shaft and gear means interconnecting said fine tuning shaft and said cam driving member.

17. A tuning system as recited in claim 16 wherein said gear means includes a plurality of gears rotatably mounted to said articulated arm.

18. A tuning system as recited in claim 16 wherein said fine tuning shaft is mounted concentrically with said selector shaft.

19. A tuning system as recited in claim 18 further including means connected to said selector shaft for limiting the range of rotation of said selector shaft to seven turns.

20. A tuning system as recited in claim 7 further including means coupled to said cam follower means for disengaging said cam follower from said eccentric lobe when said selector shaft is rotated between detent positions.

21. A tuning system including in combination:
a UHF television tuner having a continuously variable tuning shaft, rotation of which is effective to tune said tuner to selectively receive signals from all television channels within the UHF television band;
a selector shaft;
means for establishing a plurality of equally spaced detent positions for said selector shaft, one for each of said television stations;
a rotatable turret having a plurality of cam members mounted thereon, said turret being responsive to said selector shaft for rotating a fixed increment of rotation in response to the movement of said selector shaft between each of said detent positions;
gear means interconnecting said selector shaft and said tuning shaft, said gear means further including gear reduction means interconnecting said selector shaft and said turret for rotating said turret substantially one revolution in response to a plurality of revolutions of said selector shaft;
a fine tuning shaft;
means for selectively coupling a first predetermined one of said cam members to said fine tuning shaft when said selector shaft is positioned in a detent position within a first predetermined group of adjacent detent positions, and for coupling a second predetermined one of said cam members to said fine tuning shaft when said selector shaft is positioned in a detent position within a second predetermined group of adjacent detent positions; and
cam follower means operatively coupled to the one of said cam members selectively coupled to said fine tuning shaft and to said tuning shaft, said cam follower means being responsive to the movement of the cam member coupled thereto to rotate said tuning shaft over a predetermined range of rotation, said cam follower means including a cam follower disposed adjacent to said turret for successively engaging each one of said cam members upon rotation of said turret, each of said cam members being engaged for a predetermined of rotation of said turret corresponding to more than one detent position of said selector shaft.

22. A tuning system as recited in claim 21 wherein said predetermined range of rotation is less than the amount of rotation necessary to tune said tuner between adjacent channels.

23. A tuning system as recited in claim 22 wherein said gear means further includes an idler gear having a predetermined axis of rotation mounted for lateral movement in a plane perpendicular to said axis of rotation, said idler gear being responsive to said cam follower means to move laterally in said plane in response to the movement of one of said cam members.

24. A tuning system as recited in claim 21 wherein said selective coupling means includes a cam driving member disposed adjacent to said turret for selectively engaging the cam member being engaged by said cam follower.

25. A tuning system as recited in claim 24 wherein said selective coupling means includes a gear train coupled to said tuning shaft and a deflectable shaft coupling said gear train and said driving member, said shaft being deflectable for engaging the cam member being engaged by said cam follower over the predetermined range of rotation of said turret within said cam member is engaged by said cam follower.

26. A tuning system as recited in claim 25 further including means coupling the fine tuning shaft and said deflectable shaft for moving said cam driving member into engagement with the cam member positioned for engagement therewith in response to an axial movement of said fine tuning shaft.

27. A tuning system as recited in claim 26 wherein each of said cam members has a concave head engageable by said cam driving member.

28. A tuning system as recited in claim 21 further including a pivotally mounted arm for pivotably supporting said cam driving member for movement along the periphery of said turret.

29. A tuning system as recited in claim 28 further including a second cam coupled to said selector shaft for rotation therewith and means coupling said second cam to said cam driving member, said cam driving member being responsive to the position of said second cam for moving along the periphery of said turret in synchronism with the one of said cam members engaging said cam follower upon rotation of said selector shaft.

30. A tuning system as recited in claim 28 further including a drive train coupling said cam driving member to said fine tuning shaft for rotation therewith.

31. A tuning system as recited in claim 30 wherein said fine tuning shaft is axially moveable and further including means coupling said cam driving member and said fine tuning shaft for bringing said cam driving member into engagement with one of said cam members in response to axial movement of said fine tuning shaft.

32. A tuning system as recited in claim 21 further including means coupled to said cam follower means for disengaging said cam follower from the cam member in engagement therewith when said selector shaft is moved between detent positions.

33. A tuning system as recited in claim 32 further including means coupled to said selector shaft for limiting the range of rotation of said selector shaft to a predetermined number of revolutions corresponding to the maximum range of rotation of said tuning shaft.

34. A tuning system as recited in claim 33 wherein said gear means includes a plurality of gears and further including a torsion spring attached to one of said gears for applying a preloading torque thereto.

35. A tuning system as recited in claim 32 further including means engaging each of said cam members for retarding the rotation thereof.

36. A tuning system as recited in claim 35 wherein said retarding means includes means for frictionally engaging said cam members.

37. A tuning system as recited in claim 35 wherein said retarding means includes an extensible resilient biasing member disposed about the periphery of said turret and engaging each of said cam members.

38. A tuning system as recited in claim 26 wherein said predetermined range of rotation of said turret corresponds to the range of rotation of three successive detent positions of said selector shaft.

39. A tuning system as recited in claim 26 wherein said predetermined range of rotation of said turret corresponds to the range of rotation of five successive detent positions of said selector shaft.

* * * * *

UNITED STATES PATENT OFFICE
CERTIFICATE OF CORRECTION

Patent No. 3,990,315　　　　　　　　　Dated November 9, 1976

Inventor(s) Morton L. Weigel

It is certified that error appears in the above-identified patent and that said Letters Patent are hereby corrected as shown below:

Column 14, line 3, "within" should read -- wherein --.

Column 14, line 60, "26" should read -- 24 --.

line 64, "26" should read -- 24 --.

Signed and Sealed this

Twelfth Day of April 1977

[SEAL]

*Attest:*

RUTH C. MASON
*Attesting Officer*

C. MARSHALL DANN
*Commissioner of Patents and Trademarks*